(12) United States Patent
Spadea (10) Patent No.: US 7,332,769 B2
(45) Date of Patent: Feb. 19, 2008

(54) NON-VOLATILE MEMORY ARRANGEMENT HAVING NANOCRYSTALS

(76) Inventor: Gregorio Spadea, 18600 Percho Way, Saratoga, CA (US) 95070

( * ) Notice: Subject to any disclaimer, the term of this patent is extended or adjusted under 35 U.S.C. 154(b) by 0 days.

(21) Appl. No.: 11/204,933

(22) Filed: Aug. 17, 2005

(65) Prior Publication Data
US 2007/0040209 A1 Feb. 22, 2007

(51) Int. Cl.
*H01L 29/792* (2006.01)
(52) U.S. Cl. .............................. 257/326; 257/E29.132
(58) Field of Classification Search ................ 365/177; 257/314, 324, 326; 438/257, 261, 266
See application file for complete search history.

(56) References Cited

U.S. PATENT DOCUMENTS

| | | | | |
|---|---|---|---|---|
| 5,140,192 A | * | 8/1992 | Nogle | 326/110 |
| 5,316,961 A | * | 5/1994 | Okazawa | 438/257 |
| 5,491,655 A | * | 2/1996 | Hirose et al. | 365/177 |
| 5,978,264 A | * | 11/1999 | Onakado et al. | 365/185.11 |
| 5,999,444 A | * | 12/1999 | Fujiwara et al. | 365/185.02 |
| 6,107,659 A | * | 8/2000 | Onakado et al. | 257/318 |
| 6,284,603 B1 | * | 9/2001 | Ho Simon et al. | 438/264 |
| 6,314,037 B1 | * | 11/2001 | Shiomi et al. | 365/203 |
| 6,524,914 B1 | * | 2/2003 | He et al. | 438/264 |
| 6,606,265 B2 | * | 8/2003 | Bergemont et al. | 365/185.01 |
| 6,703,661 B2 | * | 3/2004 | Wu | 257/315 |
| 7,075,140 B2 | * | 7/2006 | Spadea | 257/315 |

* cited by examiner

*Primary Examiner*—W. David Coleman (57) ABSTRACT

The amount of current flowing in the bitline during reading of a memory cell which is in the conductive state, hereinafter called the memory cell current, can be amplified manifold by changing the above mentioned select transistors to a novel device which is described in detail. The increase of the area of the said memory arrays due to the replacement of said select transistor with the novel device is very small. In addition the novel device can be built within the pitch of said select transistor, which is the pitch of the bitline. The novel device can be used in many types of semiconductor memories, as described in the various embodiments. Static random access semiconductor memories can also benefit from the use of the novel devices.

15 Claims, 10 Drawing Sheets

Fig. 3B: Cross-section along BB

Figure 3C: Cross-section along AA

Figure 3D: Equivalent Electrical circuit

Fig. 4A: Layout                         Fig. 4B: Cross-section A-A

Figure 4C: Electrical equivalent circuit

NON-VOLATILE MEMORY ARRANGEMENT HAVING NANOCRYSTALS

CROSS-REFERENCE TO RELATED APPLICATION

This application claims the benefit of U.S. patent application entitled "Low Voltage EEPROM Memory Arrays" Ser. No. 10/896,152, filed on Jul. 20, 2004, which application is incorporated herein by reference in its entirety.

The construction of the insulated gate bipolar transistor (IGBT) and its use in nonvolatile memory arrays are described in the patent application referenced above. A common feature of the nonvolatile memory arrays described there is the use of well regions enclosed by the trench isolation so that each well region, i.e. body of each transistor, is electrically isolated from the other. With the reduction of the feature sizes of the technology, the depth of the trench isolation is reduced and this makes it more difficult to keep the well shallower than the depth of the trench isolation.

In addition in the NAND memory array described there and depicted in FIG. 18 there is a potential problem of turning on the parasitic NPN formed by the source, P-well and deep N-well diffusions. This turn on may be caused by the buildup of voltage under the source diffusion by the flow of the collector current of the IGBT within the P-well. Lowering the sheet resistance of the P-well can reduce this voltage drop. Since the PNP of the IGBT has to be built within this shallow well, there are limitations on how high the doping concentration and thus how low the sheet resistance of the P-well can be. If the depth of the P-well is larger than the depth of the trench isolation, it is easier to reduce the voltage drop. In addition it is common practice in logic and memory processes to use wells that are deeper than the oxide isolation.

TECHNICAL FIELD OF THE INVENTION

The present invention relates to semiconductor memories, which contain metal-oxide-semiconductor transistors.

DESCRIPTION OF THE RELATED ART

Figure 1:
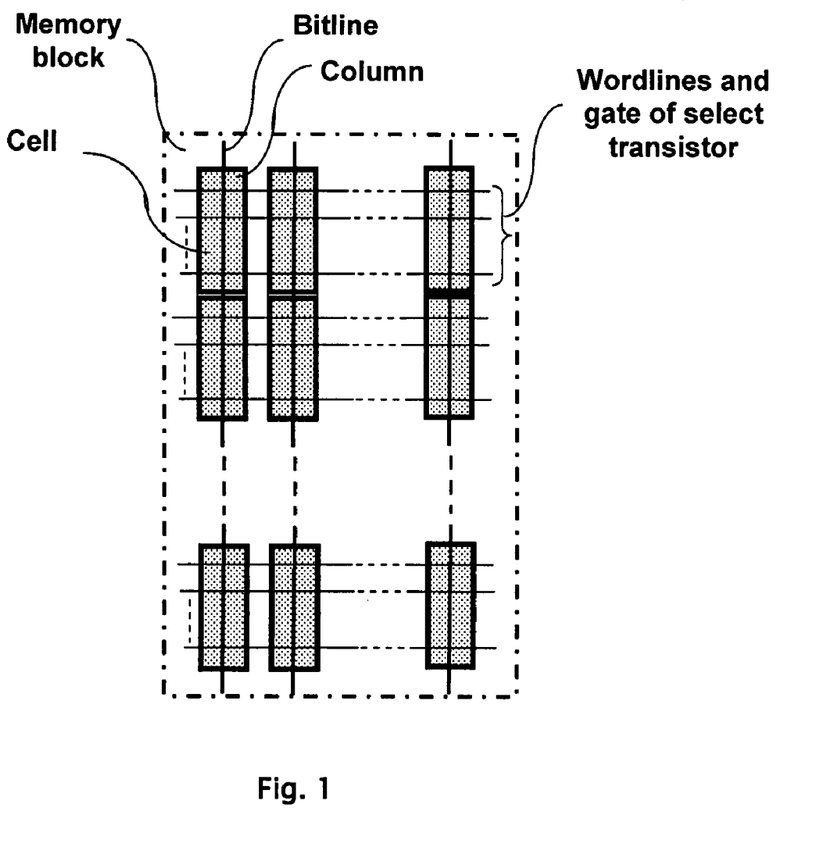
FIG. 1 describes a memory block

Semiconductor memories have been fabricated with a variety of memory cells and for a variety of purposes. It is customary to organize the arrays of memory cell into a multiplicity of memory arrays, hereinafter called memory blocks. FIG. 1 shows one of such memory blocks. Each memory block consists of a multiplicity of columns wherein each column contains a one-dimensional array of identical cells. Each column contains one bitline. Depending on the memory technology, the said identical cell is a single memory transistor whose drain is connected to the bitline, or a memory transistor connected in series with a select transistor whose drain is connected to the bitline, or a group of memory transistors connected in series or in parallel whose drains are connected to the bitline by means of a select transistor. Each memory transistor of said identical cells contains the wordline, which runs orthogonally to the bitline. When the said identical cell contains a select transistor, the control gate of the select transistors runs parallel to the wordlines.

Figure 2:
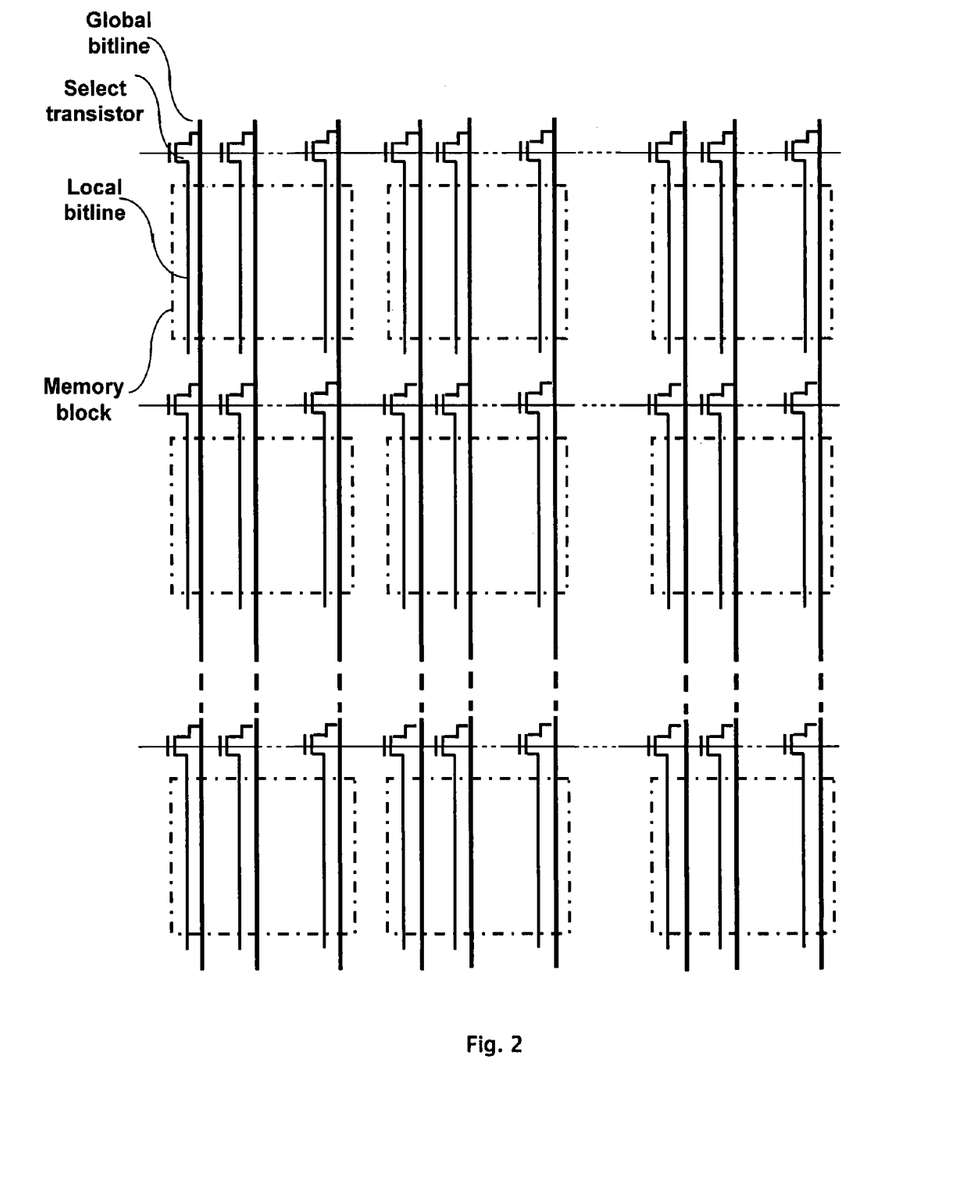

As shown in FIG. 2 the memory blocks of said semiconductor memory are organized in rows and columns. The bitlines of the memory blocks of the same column, often called the local bitlines, are connected by means of a select transistor to a second bitline, often called the global bitline, which runs directly above the local bitline. A similar approach is often used for the wordlines, but is not shown in FIG. 2. The global bitlines are connected to the sense amplifiers by the column decoder.

In conclusion select transistors are used extensively in semiconductor memories either within said identical cells for the purpose of connecting them to the local bitline or to connect the local bitlines to the global bitlines.

The current flowing in the bitline is equal to the current flowing into the memory cell which has been selected by applying an appropriate voltage to its wordline, assuming that the selected memory cell is in the conductive state. A large portion of the time interval between the time the address is applied to the wordline and the time when the output is available, often called the random access time, depends on the value of the current flowing in the bitline and the higher the current the smaller said portion becomes. Increasing the amount of the current flowing in the bitline during reading of a memory cell, which is in the conductive state, without a significant increase of the area of said memory arrays, is therefore highly desirable.

BRIEF DESCRIPTION OF THE DRAWINGS

FIG. 2 describes the use of the global bitlines and the way they are connected to the local bitlines of the memory blocks FIG. 3 contains views and schematic representation of the novel device FIG. 4 contains views and schematic representation of the novel device with a metal-oxide-semiconductor transistor used for shorting the emitter-base junction of the bipolar transistor FIG. 5 contains the schematic representation of the novel device with a resistor connecting the emitter to the base diffusion of the bipolar transistor FIG. 6 contains the schematic representation of a multiplicity of memory blocks where the novel device and the shorting means is used to connect the local bitlines to the global bitlines.

DESCRIPTION OF THE NOVEL DEVICE

The novel device was first described in the U.S. patent Ser. No. 10/896,152, mentioned above and whose layout, cross-sectional views and equivalent electrical circuit are reproduced here in FIG. 3A-3D. In said description the depth of the P-well was specified to be shallower than the depth of the oxide isolation, which in said description was specified to be made using the shallow trench isolation technology. In the present disclosure such limitation is removed and the depth of the P-well is larger than the depth of the oxide isolation. This change of the construction of the novel device doesn't change the properties of the device. In a conventional CMOS process the P-well is deeper than the oxide isolation. In processes used for the fabrication of semiconductor memories, which require a P-well electrically isolated from the p-type substrate by means of a N-well (usually called a Deep N-well), the depth of the P-well is larger than the depth of the oxide isolation. Therefore the novel device with a deeper P-well can be built in an existing CMOS or memory process in a more straightforward manner.

Figure 3A:
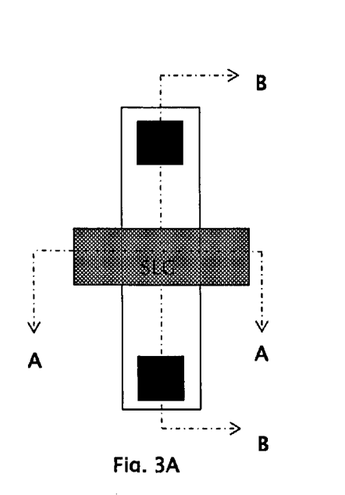
Figure 3B:
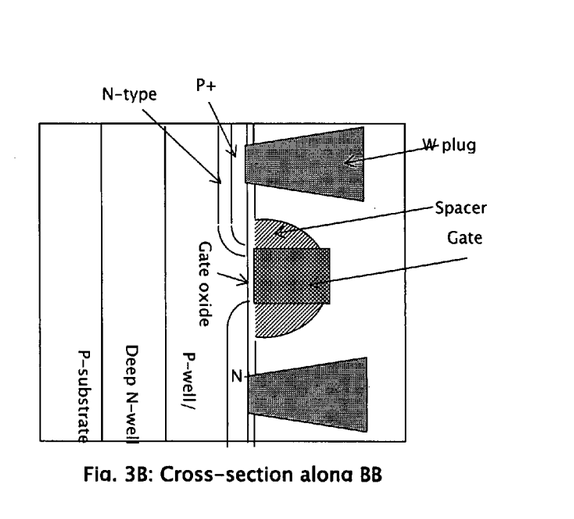
Figure 3C:
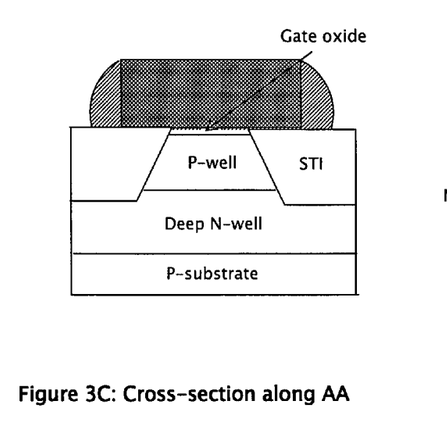
Figure 3D:
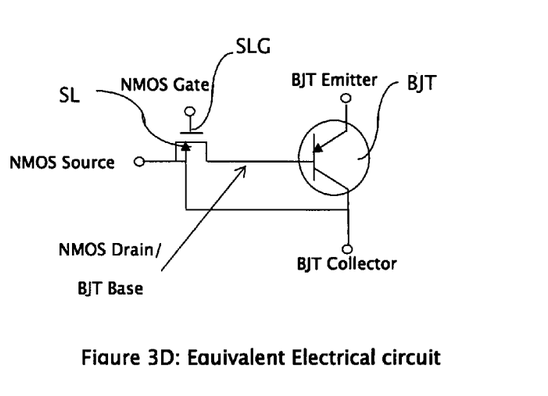

The electrical equivalent circuit of the novel device depicted in FIG. 3D contains a PNP bipolar transistor BJT whose base diffusion is the drain of the N-channel metal-oxide-semiconductor transistor SL with gate SLG.

The novel device depicted in FIG. 3 is suitable for connecting selectively a first metal line which uses the first level of interconnects and which is terminated over the source of SL to a metal line which uses the second level of interconnects and which runs above said first metal line. This connection is used extensively in semiconductor memories for connecting or disconnecting a local bitline to a global bitline.

When to source diffusion of SL is merged with the drain diffusion of a nonvolatile memory transistor, the novel device provide the select function conventionally done with a metal-oxide-semiconductor transistor.

The novel device can also be used to replace a conventional metal-oxide-semiconductor transistor in the memory cell of a static random access memory.

In the three applications described above the novel device provides an output current, measured at the emitter of BJT, which is larger than the input current that enters the source of SL.

The novel device has two limitations, which may prevent its use in several types of nonvolatile semiconductor memories.

The first limitation relates to the current flow in a bipolar transistor which is unidirectional, with a large current flow, in the order of tens to hundreds microamperes, when its emitter-base junction is forward biased and a small leakage current flow, of the order of picoamperes, when said junction is reverse biased. During the operation of several types of nonvolatile semiconductor memories, the BJT is reverse biased and it is necessary for a proper operation to obtain a current flow in the bitline several orders of magnitude higher than the small leakage current flow provided by the BJT.

The second limitation relates to the limited voltage sustaining capability of a bipolar transistor when a positive bias is applied to its emitter when its base is left floating. This limitation is measured by the BVceo parameter that indicates the maximum reverse bias that can be applied to the emitter with the collector grounded and the base open. The BVceo is equal to the parameter BVces multiplied by a factor which is proportional to the current gain of the bipolar transistor, where BVces is the maximum reverse bias which can be applied to the emitter with the base shorted to the emitter.

These two limitations are overcome by adding a mean to connect the emitter and base diffusions when the BJT is turned off.

Figure 4A:
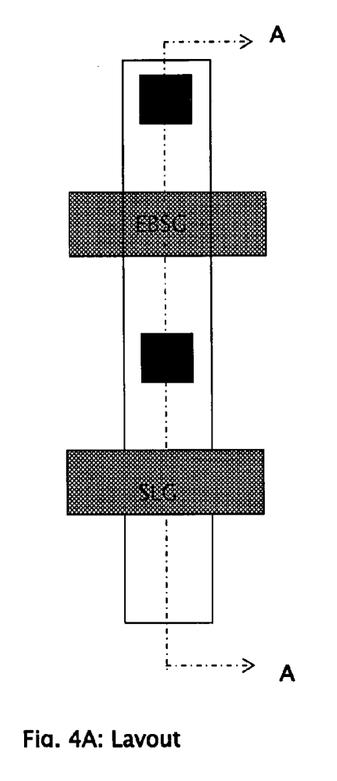
Figure 4B:
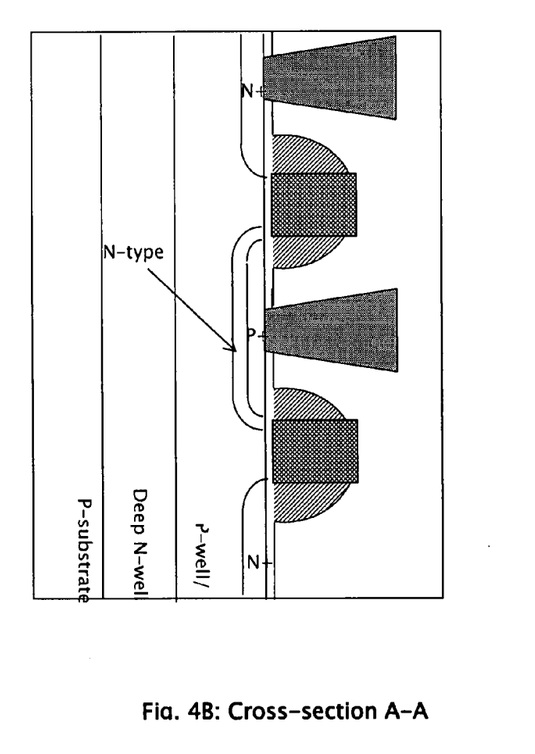
Figure 4C:
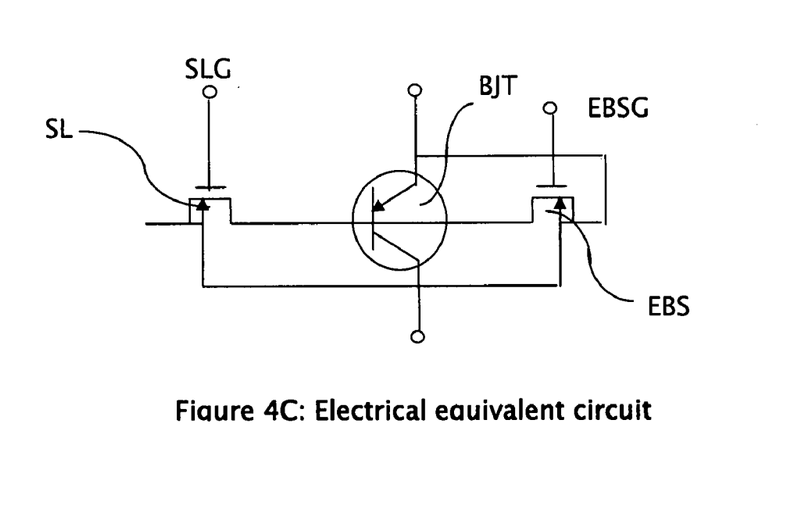

Referring to FIG. 4 the first implementation of said mean is to add a metal-oxide-semiconductor transistor labeled EBS whose N+ drain diffusion is shorted with metal to the emitter. The gate EBSG of EBS is drawn parallel to the select gate of the novel device. When the emitter-base junction needs to be forward biased EBS is turned off, otherwise is turned on. The addition of EBS to the novel device increase the sustaining voltage from the BVceo value to a new value which depends on the value of the channel resistance of EBS. In addition it provides a path for connecting the bitline to the source of the novel device.

Figure 5:
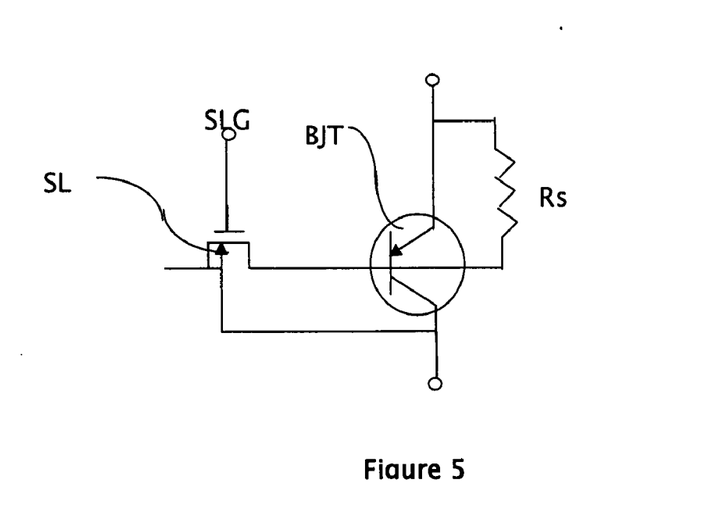

The second implementation of said mean is to insert a resistor Rs between the base and emitter diffusion of BJT, as shown in the electrical equivalent circuit of FIG. 5. When the novel device is used as a select device and Rs is sufficiently large, it is easy to understand that the presence of Rs has little effect on the forward characteristic of BJT. When there is no base current supplied to the BJT, the effect of Rs is to bring the base of BJT to the same voltage of the emitter and this solves the BVceo problem. When the emitter-base junction of the BJT is reverse biased, current can flow from the source of the novel device to the bitline through Rs.

DESCRIPTION OF THE PREFERRED EMBODIMENTS

Figure 6:
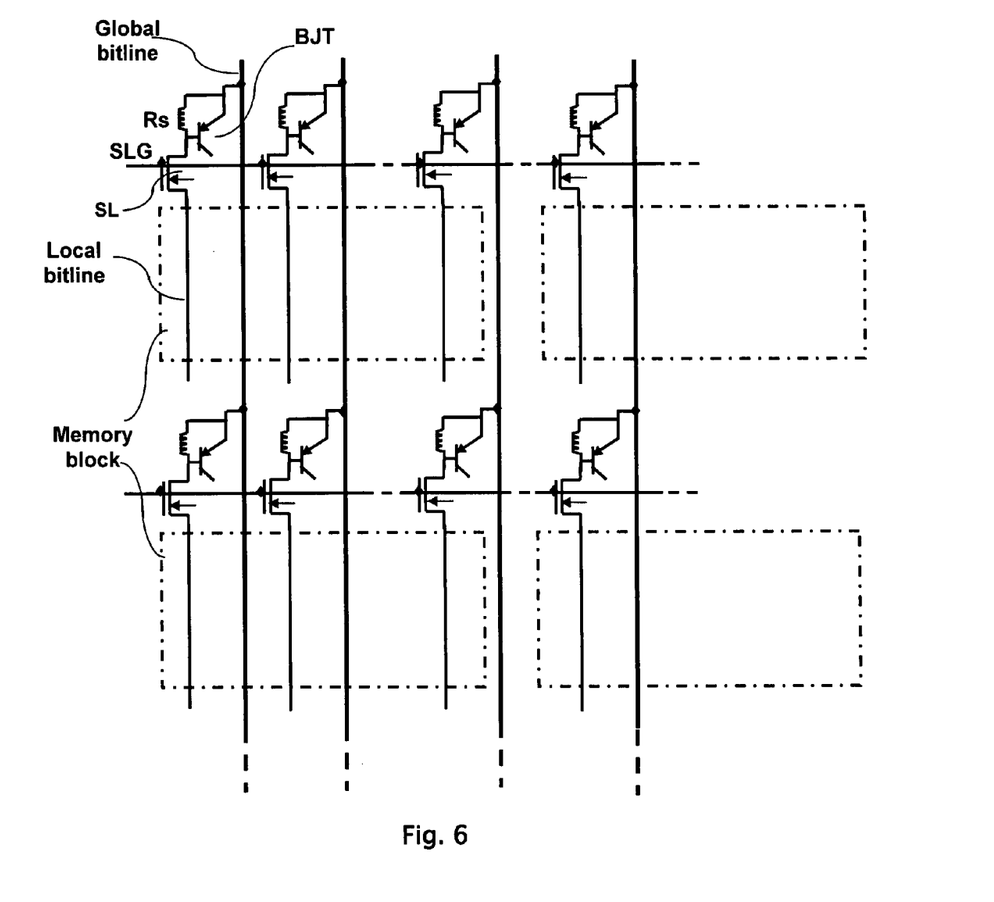

The preferred embodiments which use the novel device and the shorting means are now described. The first embodiment is described with the aid of FIG. 6. The memory block contains an array of nonvolatile memory cell organized in rows and columns. The local bitlines belonging to the memory block are connected to the source of SL and the global bitlines to the emitter of the PNP bipolar transistor BJT. Added to the BJT is the resistor Rs, which provides the shorting means described above. Instead of the resistor the shorting means can be achieved by using the metal-oxide-semiconductor transistor described above for such purpose and labeled EBS in FIG. 4c. Each memory block and the novel devices connected to its local bitline are contained within a well, which can be separate from the wells of other memory blocks or common. The well can be a P-well and in this case novel device consists of a PNP bipolar transistor and a NMOS select transistor. If the non volatile memory cells use a P-channel metal-oxide-semiconductor memory transistor built over a N-well, the novel devices connected to the memory blocks consist of a NPN bipolar transistor and a PMOS select transistor. The array of memory blocks depicted in FIG. 6 is similar to the conventional array of FIG. 2 except for the replacement of the select transistor of FIG. 2 with the novel device and the shorting means. The novel device supplies to the global bitline an amplified amount of the current that flows in the local bitline.

Figure 7:
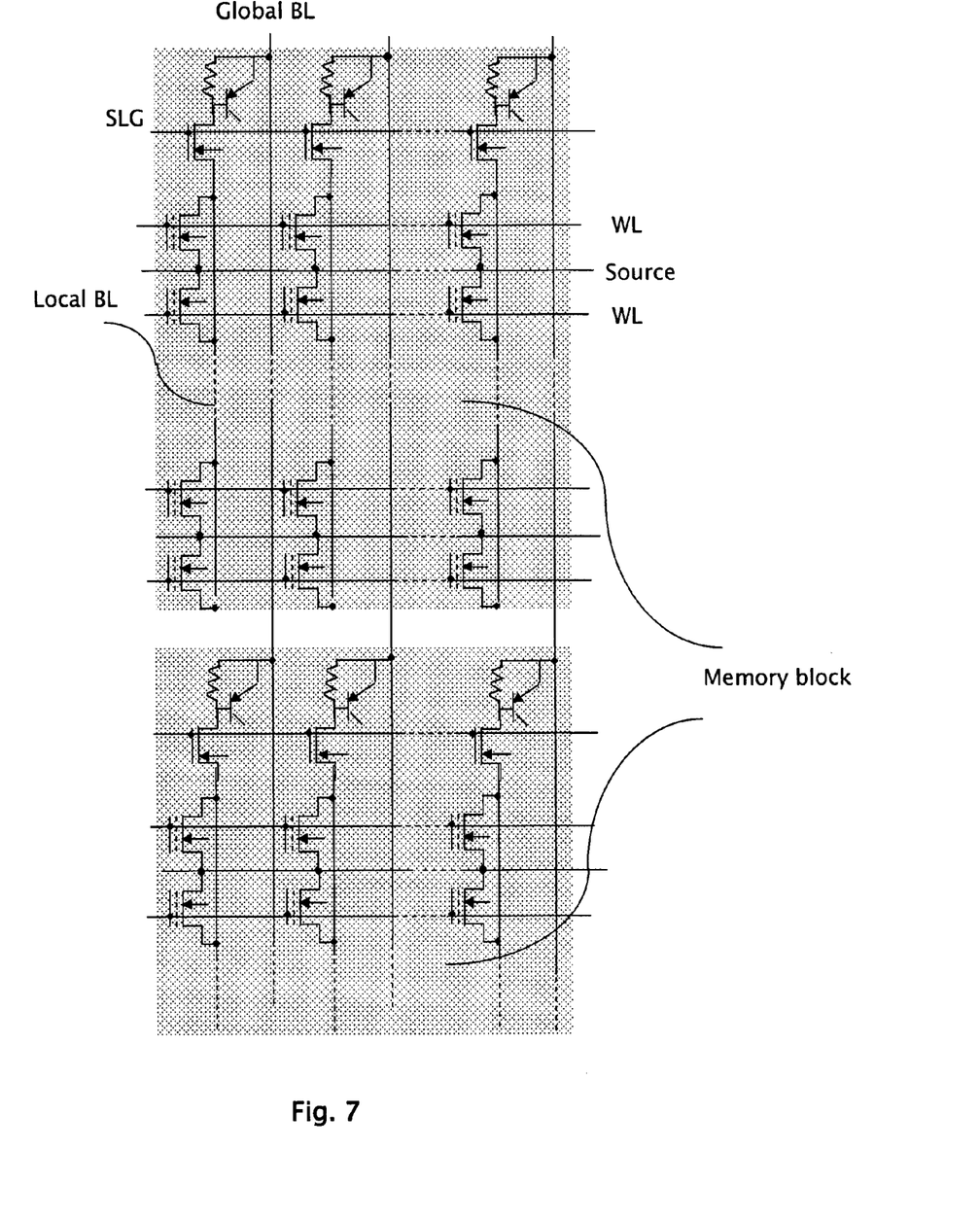
FIG. 7 contains the schematic representation of two NOR memory blocks where the novel device and the shorting means is used to connect the local bitlines to the global bitlines FIG. 8 contains the schematic representation of portions of NAND memory blocks where the novel device and the shorting means replaces the select transistor used in conventional NAND memory arrays for connecting the bitline to the drain of the top memory cell of the stack of the memory cells connected in series.

For example the nonvolatile memory cells contained in the memory block can be NOR single transistor memory cells and the memory transistor is a N-channel metal-oxide-semiconductor transistor. Two of said memory blocks are depicted in FIG. 7. The memory cells of the memory block are contained in a single P-well diffused into a P-type substrate or said P-well is electrically isolated from said substrate by a N-well, using the so called triple well process or said P-well is diffused into a N-type substrate. The bipolar transistor of the novel device uses said P-well as the collector The floating gate of the memory cell can be made of polysilicon or comprises a charge trapping layer containing silicon and nitrogen or comprises a charge trapping material containing nanocrystals. It should be clear to people skilled in the art that the insertion of the novel device as shown in the figure doesn't change the methods used for programming, erasing or reading the memory cells. The amplification of the memory cell current provided by the novel device reduces the read access time of the memory. This improvement applies to NOR memories where a single bit is stored in each memory transistor or where two or more bits are stored.

Figure 8:
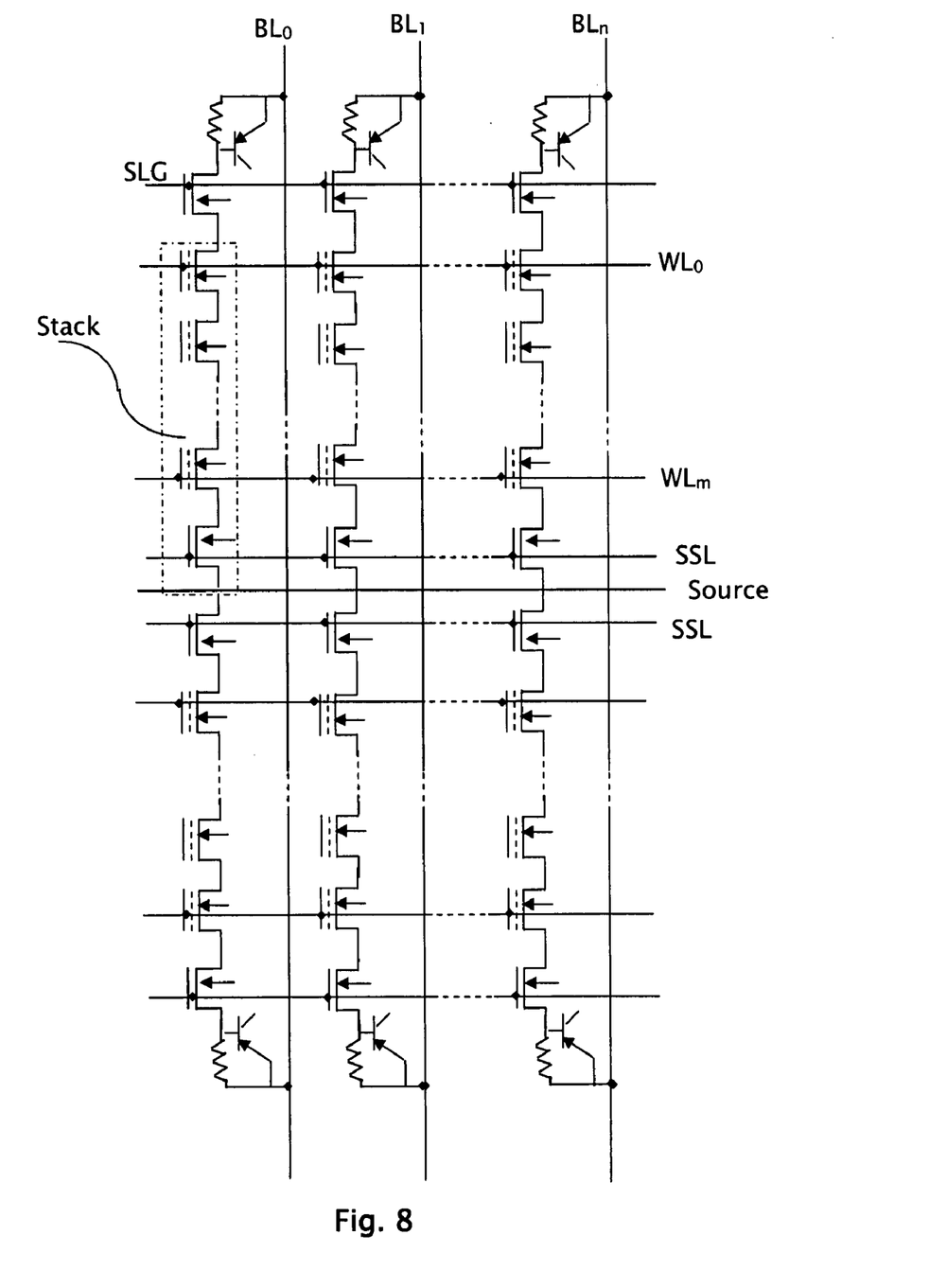

The second embodiment is described with the aid of FIG. 8. Shown there is a memory block consisting of n+1 columns containing two stacks of (m+1) memory transistors connected in series, as it is done in NAND memories. One end of the stack is connected to the source by means of the select transistor whose gate is labeled SSL, as in conventional NAND memories. The other end of the stack is connected to the novel device and its shorting device, shown in this case as a resistor. The other type of shorting device can be used. The novel device replaces the select transistor used in conventional NAND memories for connecting said other end to the bitline. The memory cells of the memory block are contained in a P-well that is electrically isolated from a P-type substrate by a N-well (triple well process) or said P-well is diffused into a N-type substrate. The bipolar transistor of the novel device uses said P-well as the collector. The floating gate of the memory cell can be made of polysilicon or comprises a charge trapping layer containing silicon and nitrogen or comprises a charge trapping material containing nanocrystals. It should be clear to people skilled in the art that the insertion of the novel device as shown in the figure doesn't change the methods used for programming, erasing or reading the memory cells. The amplification of the memory cell current provided by the novel device reduces the read access time of the memory. This improvement applies to NAND memories where a single bit is stored in each memory transistor or where two or more bits are stored.

Figure 9:
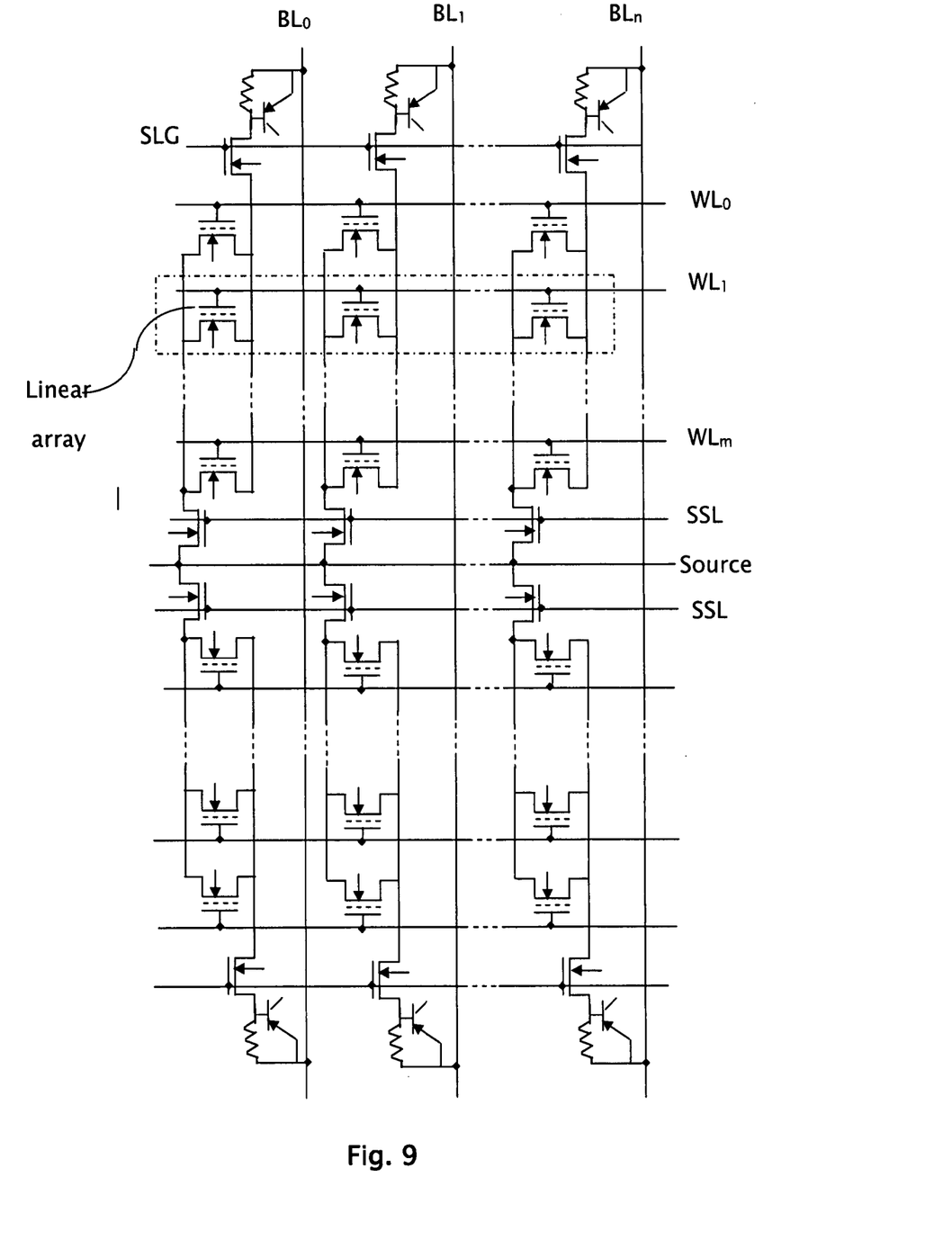
FIG. 9 contains the schematic representation of portions of AND memory blocks where the novel device and the shorting means replaces the select transistor used in conventional AND memory arrays to connect the drains of the memory cells connected in parallel.

The third embodiment is described with the aid of FIG. 9. Shown there is a portion of a memory block consisting of n+1 columns containing linear arrays of (m+1) memory transistors. The drains of the memory transistors are shorted together and connected to the bitlines by means of the novel device and its shorting device. Their sources are also shorted together and are connected to the source line by means of the NMOS transistor whose gate is labeled SSL. AND memories use this organization. In AND memories the device connecting the shorted drains to the bitline is a metal-oxide-semiconductor transistor and m is typically equal to 31. The memory cells of the memory block are contained in a P-well that is electrically isolated from a P-type substrate by a N-well (triple well process) or said P-well is diffused into a N-type substrate. The bipolar transistor of the novel device uses said P-well as the collector. The floating gate of the memory cell can be made of polysilicon or comprises a charge trapping layer containing silicon and nitrogen or comprises a charge trapping material containing nanocrystals. It should be clear to people skilled in the art that the insertion of the novel device as shown in the figure doesn't change the methods used for programming, erasing or reading the memory cells. The amplification of the memory cell current provided by the novel device reduces the read access time of the memory. This improvement applies to AND memories where a single bit is stored in each memory transistor or where two or more bits are stored.

Figure 10:
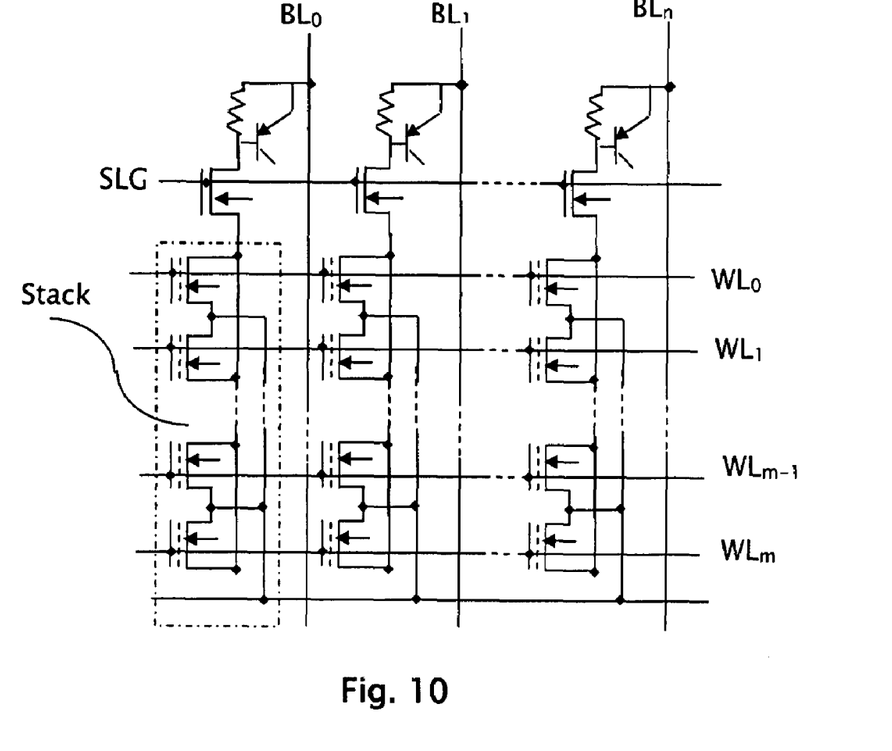
FIG. 10 contains the schematic representation of stacks of DINOR memory cells where the novel device and the shorting means replace the select transistor used in conventional DINOR memory arrays to connect the drains of the memory cells connected in parallel.

The fourth embodiment is described with the aid of FIG. 10. Shown are n+1 columns containing linear arrays of (m+1) memory transistors. There are (m+1) memory transistors whose drains are shorted together and connected to the bitlines by means of the novel device and its shorting device. Their sources are also shorted together and are directly connected to the source line. DINOR memories use this organization. In DINOR memories the device connecting the shorted drains to the bitline is a metal-oxide-semiconductor transistor and m is typically equal to 7. The memory cells of the memory block are contained in a P-well that is electrically isolated from a P-type substrate by a N-well (triple well process) or said P-well is diffused into a N-type substrate. The bipolar transistor of the novel device uses said P-well as the collector. The floating gate of the memory cell can be made of polysilicon or comprises a charge trapping layer containing silicon and nitrogen or comprises a charge trapping material containing nanocrystals. It should be clear to people skilled in the art that the insertion of the novel device as shown in the figure doesn't change the methods used for programming, erasing or reading the memory cells. The amplification of the memory cell current provided by the novel device reduces the read access time of the memory. This improvement applies to DINOR memories where a single bit is stored in each memory transistor or where two or more bits are stored.

What is claimed is:

1. A memory block of a semiconductor memory array of a NOR type, comprising a bit line. memory cells which comprise a multilayer charge trapping medium containing nanocrystals, a metal-oxide-semiconductor select transistor that separates said bit line and said memory cells, a semiconductor region enclosed within the drain of said select transistor with a conductivity type that is opposite to that of said drain, and a semiconductor well region shared by said select transistor and said memory cells.

2. The memory block of claim 1 wherein said memory array is a NAND type array.

3. The memory block of claim 1 wherein said memory array is a AND type array.

4. The memory block of claim 1 wherein said memory array is a DINOR type array.

5. The memory block of claim 1 comprising additionally a means to electrically connect said region and said drain.

6. The memory block of claim 5 wherein the nonvolatile array is a NAND array.

7. The memory block of claim 5 wherein the nonvolatile array is a AND array.

8. The memory block of claim 5 wherein the nonvolatile array is a DINOR array.

9. The memory array of claim 5 wherein said array is built with a semiconductor manufacturing process which uses more than one well.

10. The memory array of claim 6 wherein said array is built with a semiconductor manufacturing process, which uses more than one well.

11. The nonvolatile memory array of claim 7 wherein said array is built with a semiconductor manufacturing process which uses more than one well.

12. The memory block of any of the claims 5, 6, 7 and or 8 wherein said means is a metal-oxide-semiconductor transistor which can be set to the on or off state independent of the state of said select transistor.

13. The memory block of claims 5, 6, 7 and or 8 wherein said means is a resistor.

14. The nonvolatile memory array of claim 8 wherein said array is built with a semiconductor manufacturing process which uses more than one well.

15. The memory array of claims 5, 6, 7 and or 8 wherein said memory array is built with a silicon-on-insulator technology.

* * * * *